US006733616B2

United States Patent
Hu et al.

(10) Patent No.: US 6,733,616 B2
(45) Date of Patent: May 11, 2004

(54) SURFACE ISOLATION DEVICE

(75) Inventors: Hung-Sheng Hu, Kao-Hsiung (TW); Tsung-Ping Hsu, Tao-Yuan Hsien (TW); Wei-Lin Chen, Taipei (TW); Chung-Cheng Chou, Taipei (TW); In-Yao Lee, Taipei Hsien (TW)

(73) Assignee: BenQ Corporation, Tao-Yuan Hsien (TW)

( * ) Notice: Subject to any disclaimer, the term of this patent is extended or adjusted under 35 U.S.C. 154(b) by 74 days.

(21) Appl. No.: 10/063,878

(22) Filed: May 21, 2002

(65) Prior Publication Data

US 2002/0174951 A1 Nov. 28, 2002

(30) Foreign Application Priority Data

May 25, 2001 (TW) .................................. 90112706 A

(51) Int. Cl.[7] .................................................. H05H 1/00
(52) U.S. Cl. ............................ 156/345.14; 156/345.19; 156/345.23
(58) Field of Search ........................ 156/345.14, 345.19, 156/345.23

(56) References Cited

U.S. PATENT DOCUMENTS 5,280,894 A * 1/1994 Witcraft et al. ............. 269/287
6,171,437 B1 * 1/2001 Shimizu et al. ......... 156/345.23

* cited by examiner

Primary Examiner—P. Hassanzadah
Assistant Examiner—Sylvia R. MacArthur
(74) Attorney, Agent, or Firm—Winston Hsu

(57) ABSTRACT

A surface isolation device for isolating a predetermined area of a second surface of a wafer from an etching solution while the etching solution etches a first surface of the wafer to form a plurality of manifolds in the wafer. The surface isolation device has a base for positioning the wafer, a fixture for fixing the wafer on the base, and an isolation ring positioned on the base for isolating the predetermined area from the etching solution. When the fixture fixes the wafer on the base, the wafer sticks to the isolation ring, forming a seal that isolates the predetermined area from the etching solution.

17 Claims, 17 Drawing Sheets

SURFACE ISOLATION DEVICE

BACKGROUND OF INVENTION

1. Field of the Invention

The present invention relates to a surface isolation device, and more particularly, to a surface isolation device for isolating a wafer from an etching solution during the fabrication of a print head.

2. Description of the Prior Art

Today's computer users are becoming increasingly knowledgeable about technology. As a result they are demanding better and cheaper computer peripherals for making hard copies of their documents. Due to their high print quality and low cost, ink jet printers are extensively used to print documents. A typical inkjet printer comprises a print head, and documents are printed by ejecting ink droplets from several nozzles in the print head onto paper. The print head comprises at least one manifold and several chambers. The manifold is used to supply ink to the chambers. Each chamber comprises a nozzle, the nozzle comprising an orifice and a pressurizing device. The pressurizing device is normally a heater that is used to heat the ink in the chamber to produce bubbles, which push the ink out of the chamber in the form of ink droplets.

The manifolds are usually formed internally in the print head. In the early days of print head manufacturing, sandblasting processes were performed to form the manifolds in the print head. However, sandblasting is a low-precision process and causes deviations in the positions of the manifold and rough edges, negatively affecting the quality and yield of the print heads. In order to prevent the above-mentioned problems, the manifold fabrication method using sandblasting processes has been gradually replaced by a method where manifolds are produced by performing an etching process on a single crystal wafer. However, this etching process includes forming a hole as the manifold, so the required time for the etching process would be relatively long. Because etching solutions are usually strong acids or strong bases, the wafer can be easily damaged and cracked during lengthy etching processes. In addition, if another circuit, such as a heater is already formed on the wafer, the heater will be affected by the etching solutions and may not operate normally.

Methods have been devised to decrease damage caused to the wafer and the circuit by the etching solution. In prior art methods, such as U.S. Pat. No. 5,841,452 "Method of fabricating bubble jet print devices using semiconductor fabrication techniques," when performing a lengthy etching process, a hard passivation film is deposited on the top and bottom of the wafer. After formation of the etching patterns, the wafer is put into the etching solution to be etched. FIG. 1 to FIG. 3 illustrate how circuits on a wafer 10 are isolated from an etching solution by a passivation film according to the prior art. Before an etching solution is used to etch the wafer 10 to form an orifice 18 and a chamber 20, other circuits, such as a heater 12 and a transistor 14, are formed on the wafer 10. In order to isolate these circuits from the etching solution, a glass layer 16 is deposited on the wafer 10 after forming the heater 12 and the transistor 14. The glass layer 16 acts as a passivation film for isolating the heater 12 and the transistor 14 from the etching solution. However, the process of depositing the glass layer 16 is complicated and when the etching solution etches the wafer 10, tiny holes can sometimes form at the edge of the wafer 10. These tiny holes decrease the density of the wafer and even affect the yield of forming manifolds. In addition, when depositing the glass layer 16 on the wafer 10, coating holes sometimes form on the glass layer 16. When coating holes form on the glass layer 16, the etching solution can flow through the coating holes onto circuits on the wafer. Therefore, a passivation layer formed on the wafer 10 is not ideal for isolating circuits on the wafer 10 from etching solution.

SUMMARY OF INVENTION

It is therefore an object of the claimed invention to provide a surface isolation device for isolating a surface of a wafer from an etching solution during a manifold etching process. The surface isolation device also isolates an edge of the wafer so that an etching process can be performed after the formation of a front circuit of the wafer without decreasing the wafer density.

In the claimed invention, the surface isolation device comprises a base for positioning a wafer, a fixture for fixing the wafer to the base, and an isolation ring positioned on the base for isolating a predetermined area of the wafer from etching solution. When the fixture fixes the wafer to the base, the wafer adheres to the isolation ring so as to isolate the predetermined area from the etching solution.

These and other objectives of the claimed invention will no doubt become obvious to those of ordinary skill in the art after reading the following detailed description of the preferred embodiments that are illustrated in the multiple figures and drawings.

DETAILED DESCRIPTION

Figure 1:
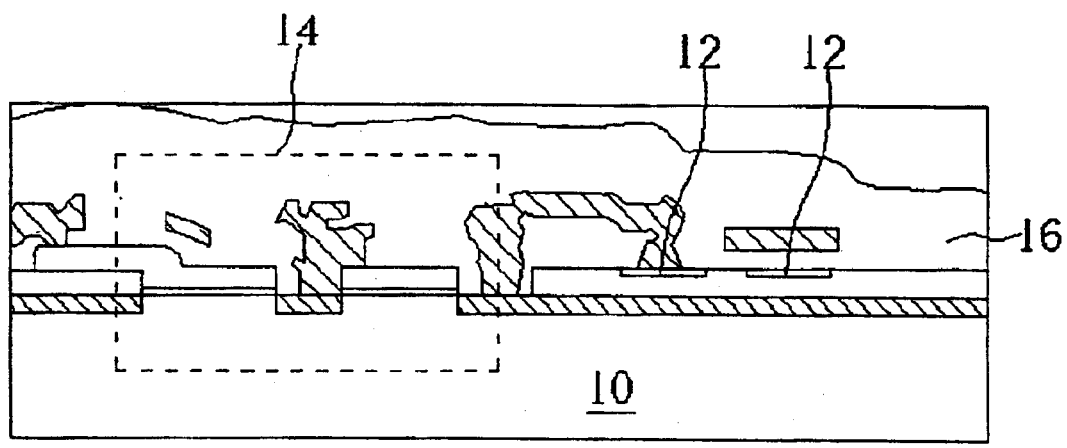
FIG. 1 through FIG. 3 are cross-sectional views showing a passivation film isolateing a circuit of a wafer from an etching solution according to the prior art.
Figure 2:
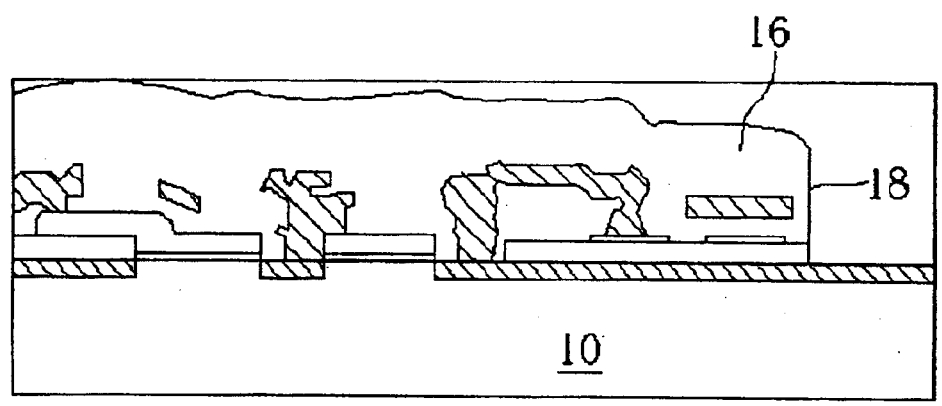
Figure 3:
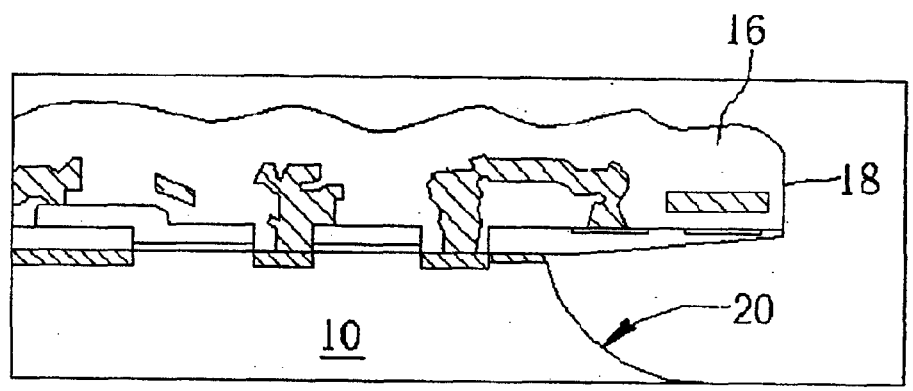
Figure 4:
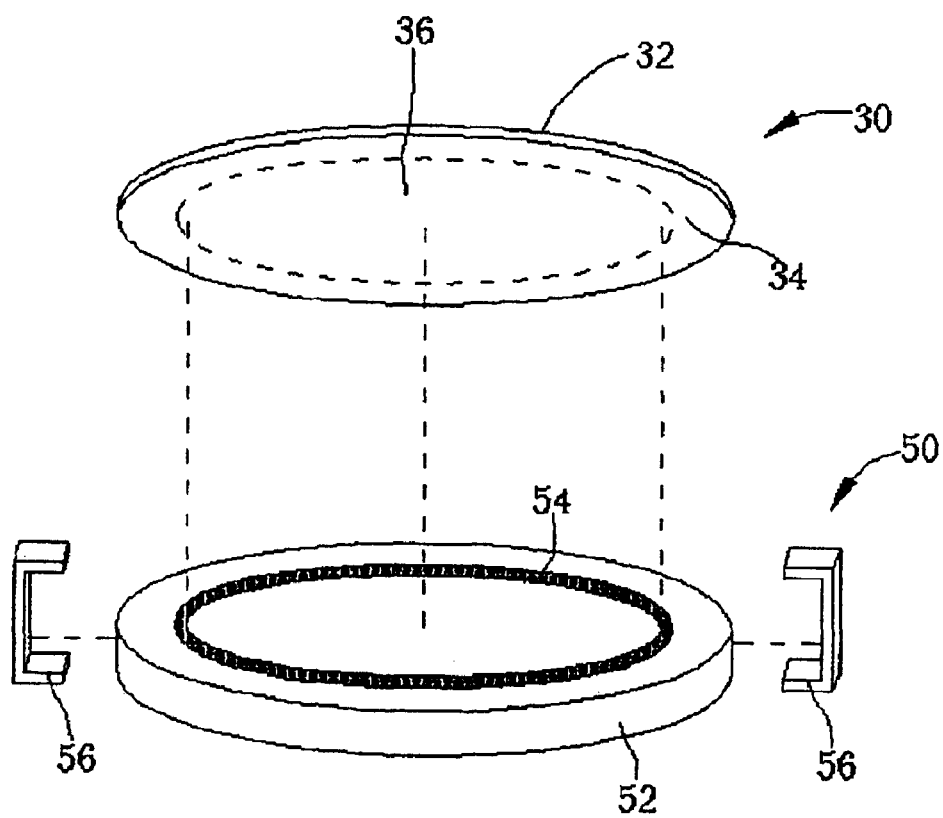
FIG. 4 is a diagram showing a surface isolation device and a wafer according to the present invention.
Figure 5:
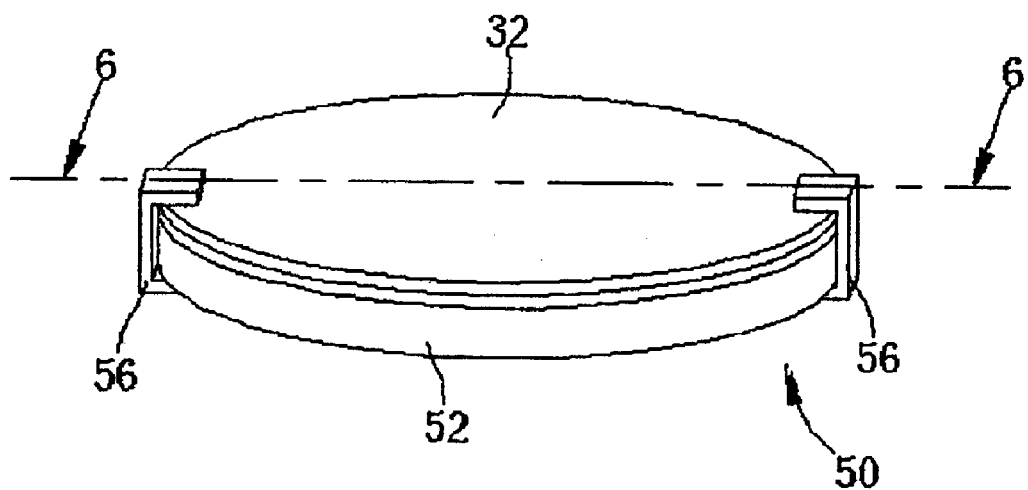
FIG. 5 is a perspective view of a surface isolation device attached to a wafer according to the present invention.
Figure 6:
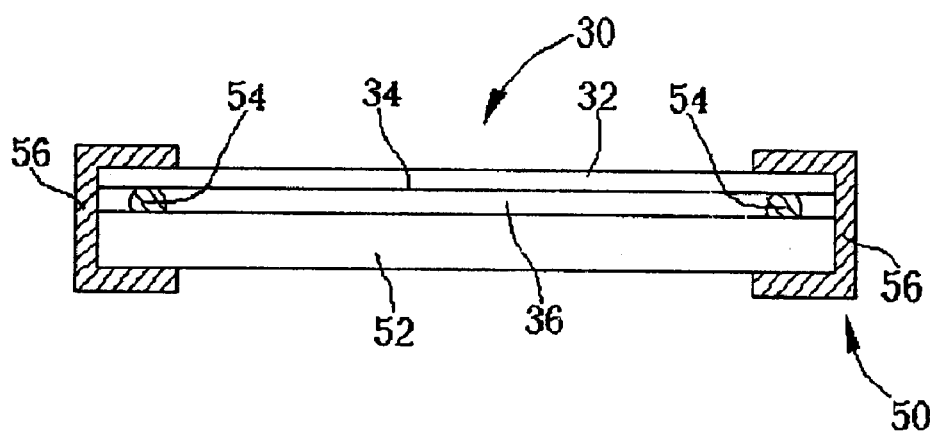
FIG. 6 is a cross-sectional view along line 6—6 showing a surface isolation device according to the present invention.

FIG. 4 is a diagram showing of a surface isolation device 50 and a wafer 30 according to the present invention. FIG. 5 is a perspective view of the surface isolation device 50 attached to the wafer 30 according to the present invention. FIG. 6 is a cross-sectional view along line 6—6 showing the surface isolation device 50. The surface isolation device 50 isolates a predetermined area 36 of a second surface 34 of the wafer 30 from an etching solution while the etching solution etches a plurality of manifolds and chambers on a first surface 32 of the wafer 30. The surface isolation device 50 comprises a base 52 for positioning the wafer 30, at least one fixture 56 for fixing the wafer 30 to the base 52, and a first isolation ring 54 positioned on the base 52 for isolating the predetermined area 36 of the wafer 30 from the etching solution. The first isolation ring 54 is composed of a soft sealing material with a low hardness. When the fixture 56 fixes the wafer 30 to the base 52, an external force is applied to the first isolation ring 54 and leads to distortion of the first isolation ring 54, causing the first isolation ring 54 to adhere to the second surface 34 of the wafer 30. When the fixture 56 fixes the wafer 30 to the base 52, the second surface 34 of the wafer 30 faces the base 52 and the first isolation ring 54 surrounds the predetermined area 36 for isolating the predetermined area 36 from the etching solution. In the present embodiment, each of the fixtures 56 is a clamp for clamping the wafer 30 on the base 52. Referring to FIG. 6, when the clamp 56 fixes the wafer 30 to the base 52, the second surface 34 of the wafer 30 adheres to the first isolation ring 54 so that the first isolation ring 54 isolates the predetermined area 36 from the etching solution. In addition, each component of the surface isolation device 50 is composed of anticorrosive materials for isolating the predetermined area 36 of the wafer 30 from the etching solution. The surface isolation device 50 is reusable.

Figure 7:
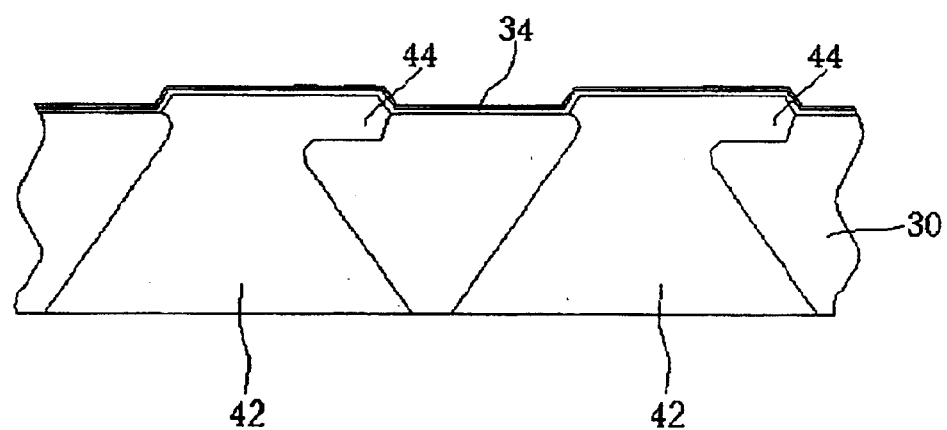
FIG. 7 is a cross-sectional view showing manifolds and chambers formed when an etching solution etches a wafer.

FIG. 7 is a cross-sectional view showing manifolds 42 and chambers 44 formed when the etching solution etches the wafer 30. Referring to FIG. 7, when the etching solution etches the first surface 32 of the wafer 30, a plurality of manifolds 42 and a plurality of chambers 44 are formed in the wafer 30, and each of the chambers 44 connects to a corresponding manifold 42. After forming the manifolds 42 and the chambers 44, the wafer 30 can be incorporated into a print head of an ink jet printer by performing just a few processes. Because the etching process decreases the thickness of the wager, a circuit is formed on the second surface 34 of the wafer 30 before the etching process is performed on the first surface 32 of the wafer 30. This practice prevents a reduction in the thickness of the wafer 30 that would occur if the manifold 42 were formed first.

Figure 8:
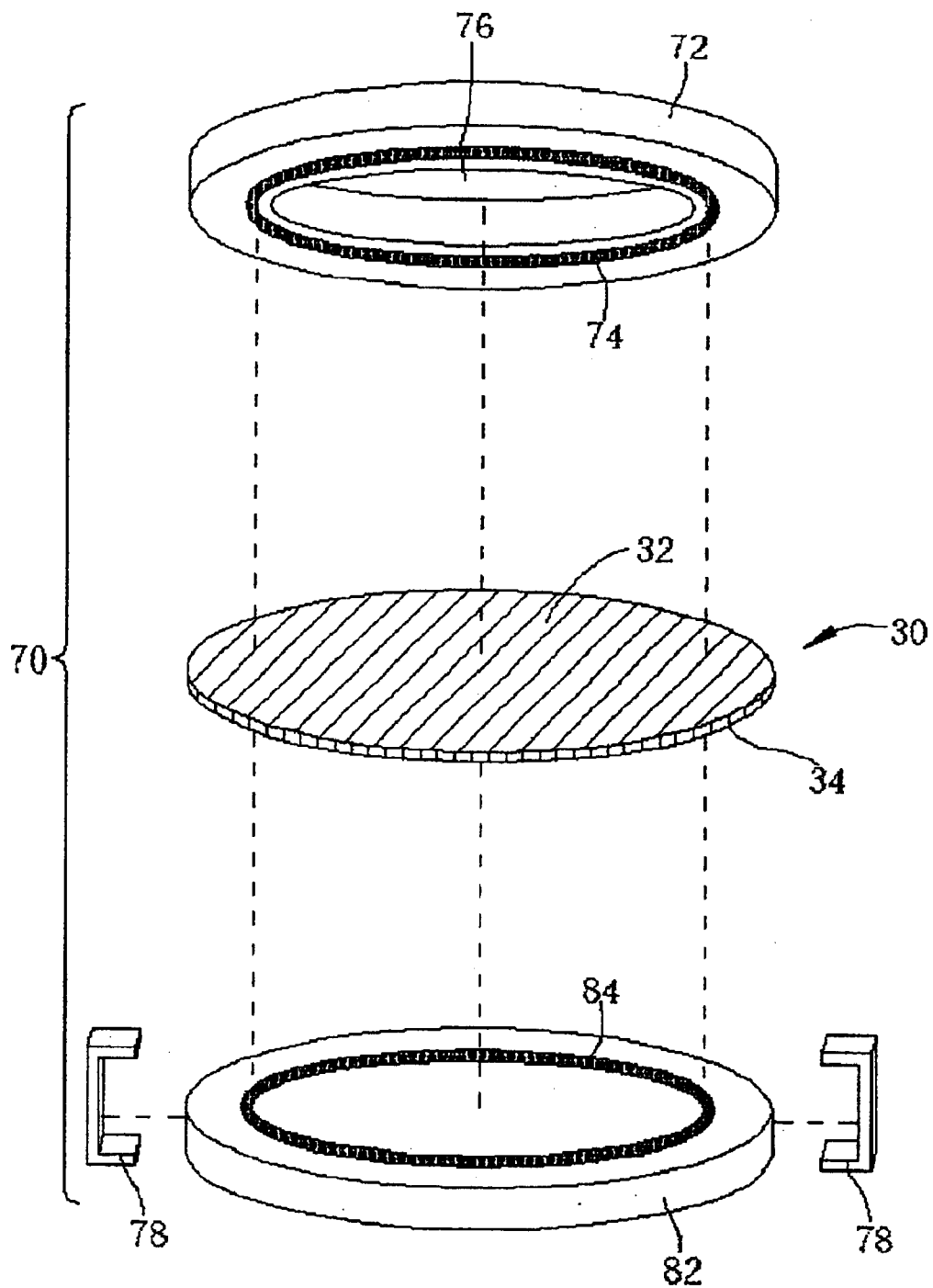
FIG. 8 is a diagram showing a surface isolation device and a wafer according to the second preferred embodiment of the present invention.
Figure 9:
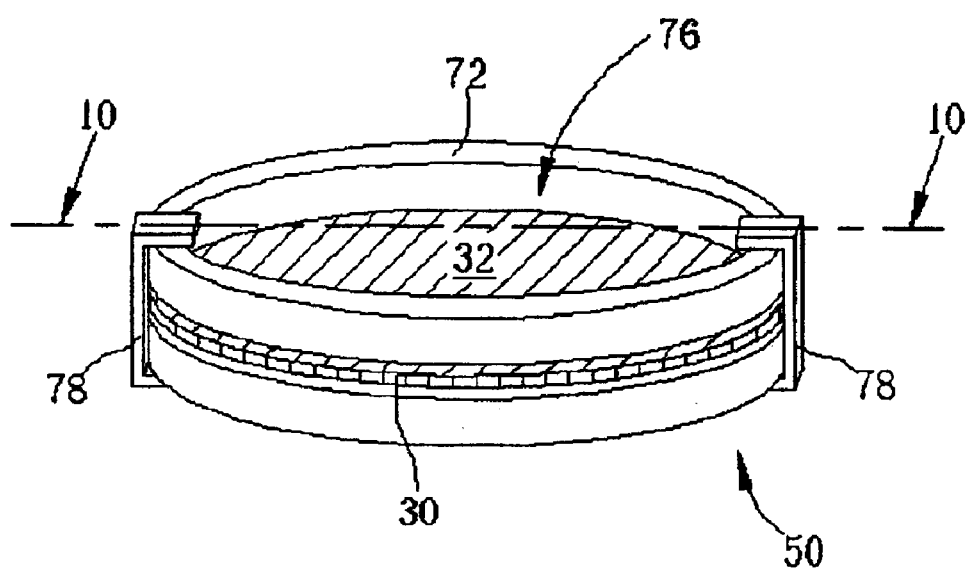
FIG. 9 is a perspective view of the surface isolation device attached to a wafer according to the second preferred embodiment of the present invention.
Figure 10:
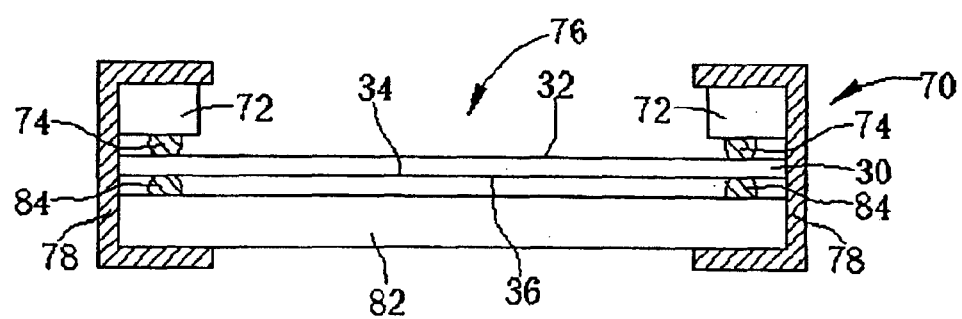
FIG. 10 is a cross-sectional view along line 10—10 showing a surface isolation device according to the second preferred embodiment of the present invention.

FIG. 8 is a diagram showing a surface isolation device 70 and a wafer 30 according to the second preferred embodiment of the present invention. FIG. 9 is a perspective view of the surface isolation device 70 attached to the wafer 30 according to the second preferred embodiment of the present invention. FIG. 10 is a cross-sectional view of the surface isolation device 70 along line 10—10. The surface isolation device 70 comprises a base 82 for positioning the wafer 30 and at least one fixture 78 for fixing the wafer 30 to the base 82. When the fixture 78 fixes the wafer 30 to the base 82, the second surface 34 of the wafer 30 adheres to an isolation ring 84 so as to isolate the predetermined area 36 from the etching solution. The surface isolation device 70 further comprises a holder 72 for fixing a second isolation ring 74. The second isolation ring 72 is composed of soft sealing materials. When the fixture 78 fixes the holder 72 above the first surface 32 of the wafer 30, an external force is applied to the second isolation ring 74 and leads to distortion of the second isolation ring 74, causing the second isolation ring 74 to adhere to the first surface 32 of the wafer 30. The holder 72 is a circular ring with an opening 76, and the etching solution is capable of flowing through the opening 76 of the holder 72 onto the first surface 32 of the wafer 30. In comparison with the first preferred embodiment, the present embodiment comprises a second isolation ring 74 composed of soft sealed materials. The wafer 30 only contacts the first isolation ring 84 and the second isolation ring 74, which helps to prevent cracking of low density wafers due to excessive external forces.

Figure 11:
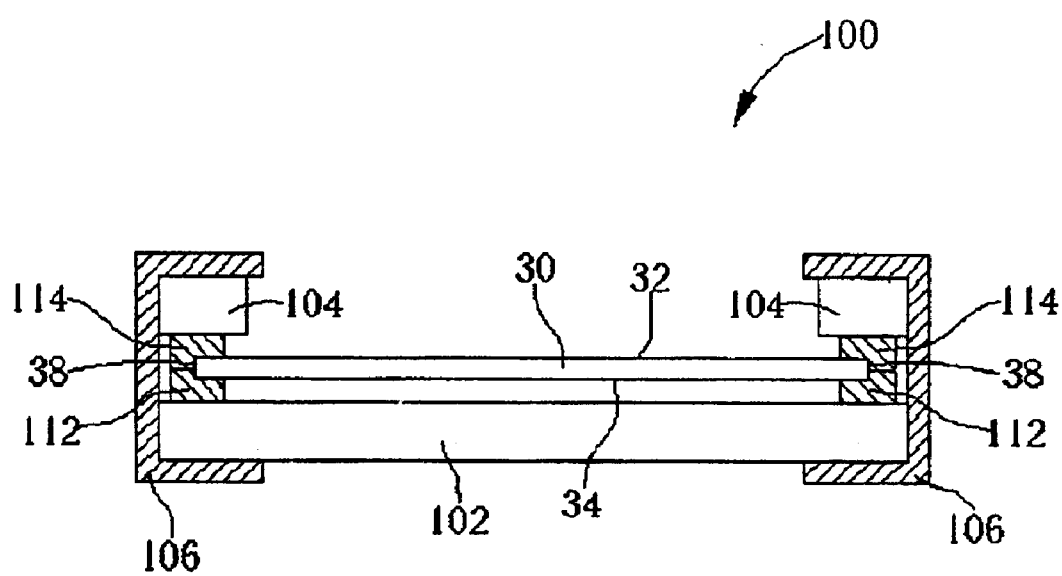
FIG. 11 is a cross-sectional view showing a surface isolation device attached to a wafer according to the third preferred embodiment of the present invention.

FIG. 11 is a cross-sectional view showing a surface isolation device 100 attached to a wafer 30 according to the third preferred embodiment of the present invention. The surface isolation device 100 comprises a base 102 for positioning the wafer 30, a holder 104, at least one fixture 106 for fixing the wafer 30 to the base 102, a first isolation ring 112 positioned on the base 102 and a second isolation ring 114 positioned on the holder 104. The first isolation ring 112 and the second isolation ring 114 are both composed of soft sealed materials. In the present embodiment, when the etching solution etches the first surface 32 of the wafer 30, the first isolation ring 112 and the second isolation ring 114 clamp an edge 38 of the wafer 30. When the first isolation ring 112 and the second isolation ring 114 contact surfaces of the wafer 30 and pressure is applied, the first isolation ring 112 and the second isolation ring 114 adhere to the wafer 30 and deform so as to follow the topography of the wafer 30. In this manner, the surface isolation device 100 isolates the edge 38 of the wafer 30 from the etching solution.

Figure 12:
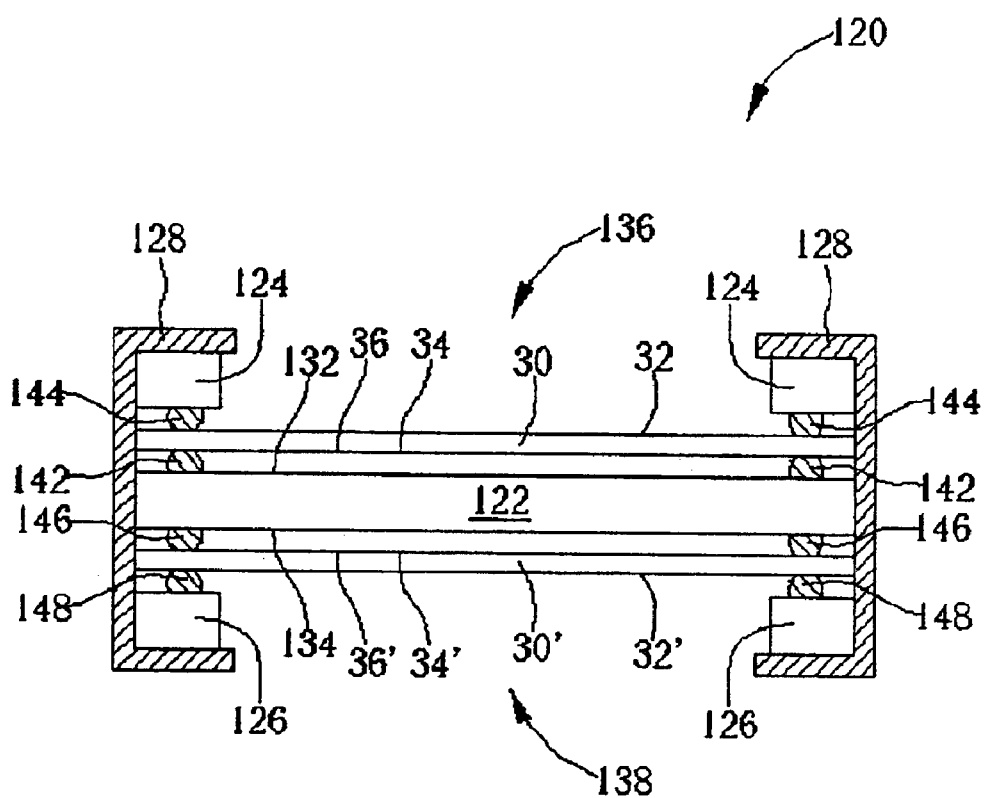
FIG. 12 is a cross-sectional view showing a surface isolation device attached to a wafer according to the fourth preferred embodiment of the present invention.

FIG. 12 is a cross-sectional view showing a surface isolation device 120 attached to a first wafer 30 and a second wafer 30 according to the fourth preferred embodiment of the present invention. In this embodiment, the surface isolation device 120 isolates a predetermined area 36 of the second surface 34 of a first wafer 30 and a predetermined area 36 of a second surface 34 of a second wafer 30 from the etching solution simultaneously. The surface isolation device 120 comprises a base 122 for positioning the wafers 30, 30". The base 122 comprises a first side 132 and a second side 134. The second surface 34 of the first wafer 30 and the second surface 34 of the second wafer 30 face the first side 132 of the base 122 and the second side 134 of the base 122, respectively. A first isolation ring 142 is positioned on the first side 132 of the base 122 and is used to isolate the predetermined area 36 of the second surface 34 of the first wafer from the etching solution. A third isolation ring 146 is positioned on the second side 134 of the base 122 for isolating the predetermined area 36 of the second surface 34 of the second wafer 30" from the etching solution. The surface isolation device 120 further comprises a first holder 124 with an opening 136, a second holder 126 with an opening 138 and at least one fixture 128. When the fixture 128 fixes the first holder 124 and the second holder 126 adjacent to the first wafer 30 and the second wafer 30", respectively. The etching solution is capable of flowing through the opening 136 of the first holder 124 onto the first surface 32 of the first wafer 30. The etching solution is also capable of flowing through the opening 138 of the second holder 126 onto the first surface 32" of the second wafer 30". In addition, a second isolation ring 144 is fixed to the first holder 124 and a fourth isolation ring 148 is fixed to the second holder 126. When the first wafer 30 and the second wafer 30" are fixed to the base 122 and the fixture 128 clamps together the first holder 124, the second holder 126, the base 122, the first wafer 30, and the second wafer 30, the first surface 32 of the first wafer 30 and the first surface 32 of the second wafer 30 adhere to the second isolation ring 142 and the fourth isolation ring 146, respectively, and the second surface 34 of the first wafer 30 and the second surface 34 of the second wafer 30 adhere to the first isolation ring 142 and the third isolation ring 146, respectively. In the manner, the surface isolation device 120 isolates the predetermined area 36 of the first wafer 30 and the predetermined area 36 of the second wafer 30 from the etching solution.

Figure 13:
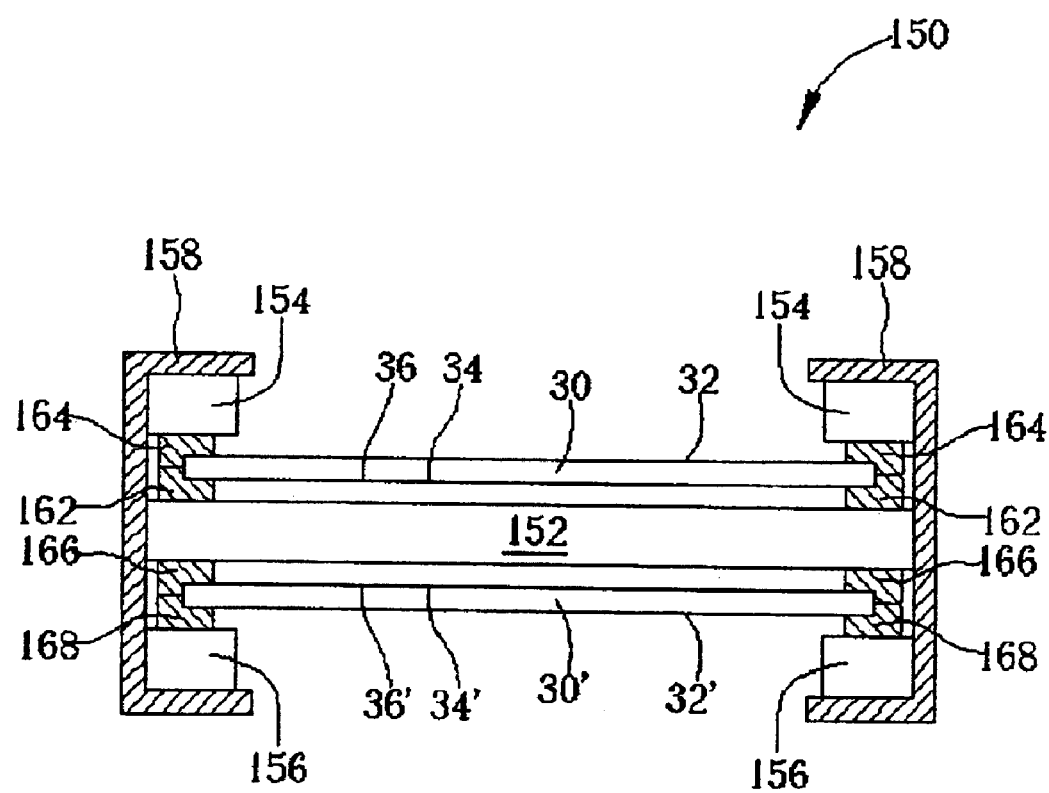
FIG. 13 is a cross-sectional view showing a surface isolation device attached to a wafer according to the fifth preferred embodiment of the present invention.

FIG. 13 is a cross-sectional view showing a surface isolation device 150 attached to a wafer 30 according to the fifth preferred embodiment of the present invention. The surface isolation device 150 comprises a base 152, a first holder 154, a second holder 156, a first isolation ring 162, a second isolation ring 164, a third isolation ring 166, a fourth isolation ring 168, and at least one fixture 158. The difference from the surface isolation device 120 of the fourth embodiment is that when the etching solution etches the first surfaces 32 of the wafers 30, 30, the first isolation ring 162 and the second isolation ring 164 clamp the edge 38 of one of the wafers 30, and the third isolation ring 166 and the fourth isolation ring 168 clamp the edge 38 of the other wafer 30". In this manner, the edges of the wafers 30, 30" are isolated from the etching solution.

Figure 14:
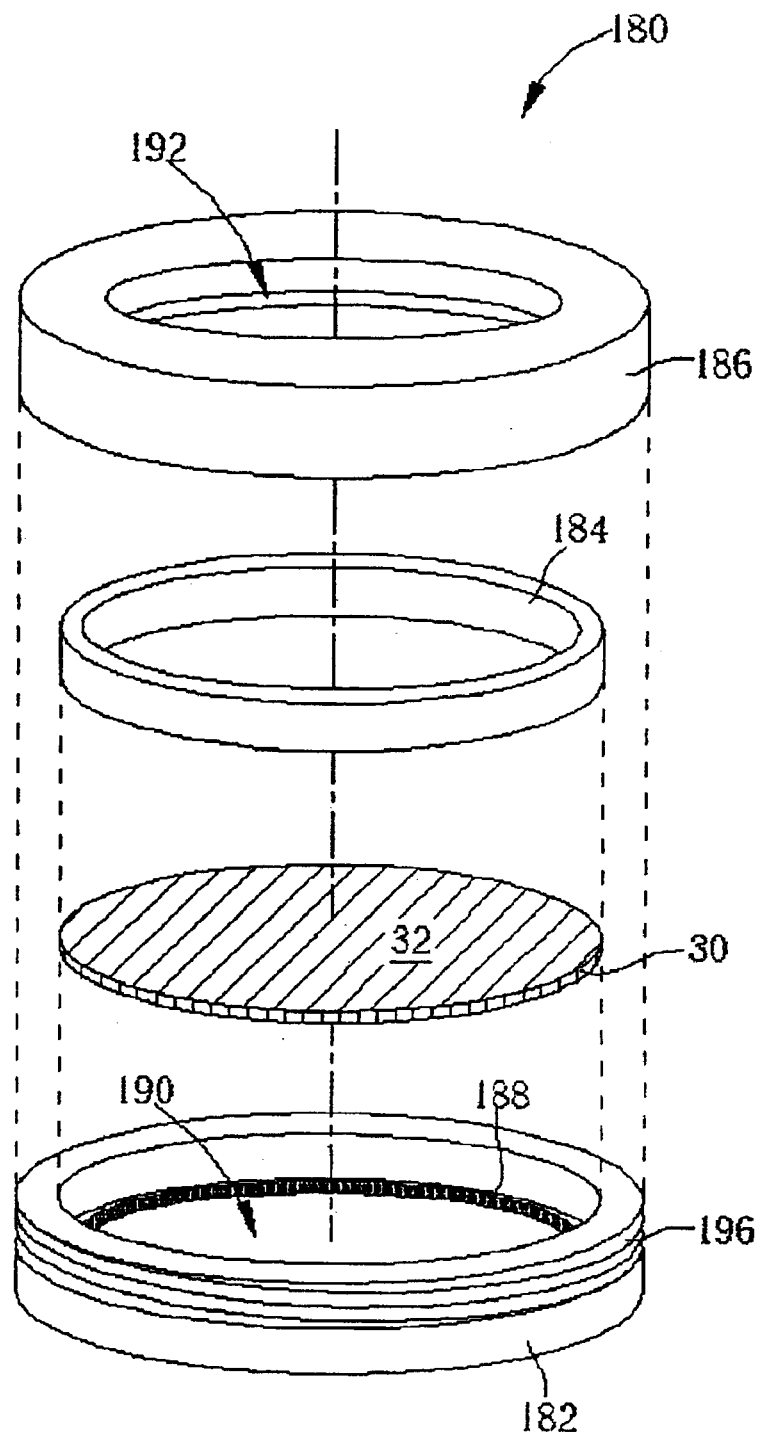
FIG. 14 is a diagram of a surface isolation device according to the sixth preferred embodiment of the present invention.
Figure 15:
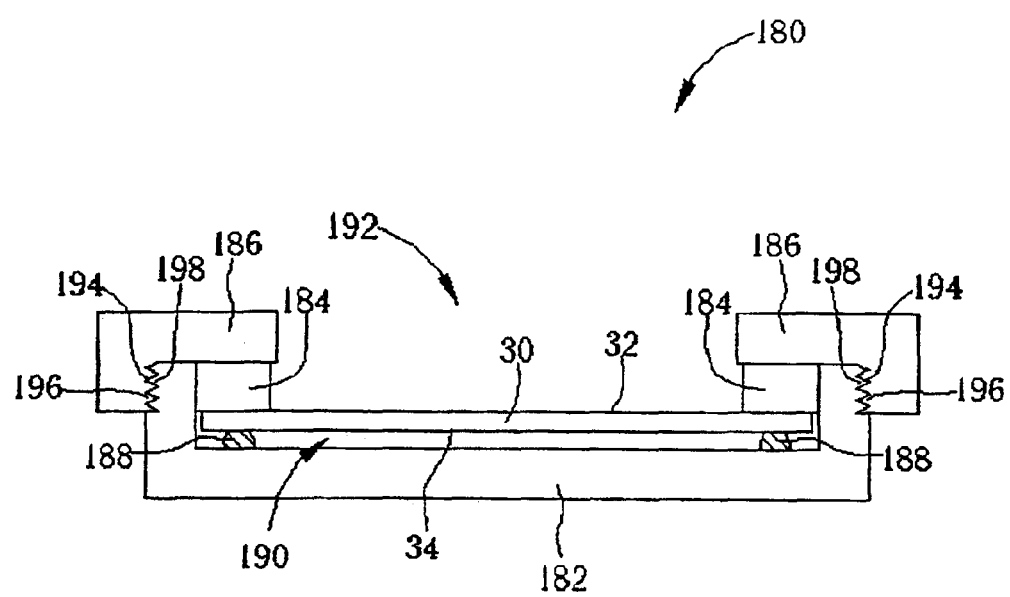
FIG. 15 is a cross-sectional view showing the surface isolation device according to the sixth preferred embodiment of the present invention.

FIG. 14 is a diagram showing a surface isolation device 180 attached to a wafer 30 according to the sixth preferred embodiment of the present invention. FIG. 15 is a cross-sectional view showing the surface isolation device 180 shown in FIG. 14. The surface isolation device 180 comprises a base 182, an attachment ring 184 and an upper cover 186. The base 182 comprises a tank 190 for placing the wafer 30, an isolation ring 188 and an attachment ring 184 located between the wafer 30 and the upper cover 186. The upper cover 186 further comprises a screw thread 196 formed on an inner surface 194 of the upper cover 186 for rotatably engaging with a second screw thread 198 on the base 182 so that the upper cover 186 is capable of gradually pushing the attachment ring 184 toward the wafer 30. Then, the wafer 30 adheres to the first isolation ring 188 to fix the wafer 30 to the base 182. The upper cover 186 comprises an opening 192 to allow the etching solution to flow onto the first surface 32 of the wafer 30. In addition, the attachment ring 184 further comprises a second isolation ring(not shown)fixed on the attachment ring 184. When the upper cover 186 pushes the attachment ring 184 toward the wafer 30, the second isolation ring adheres to the first surface 32 of the wafer 30 so as to isolate the edge 38 of the wafer 30 from the etching solution.

Figure 16:
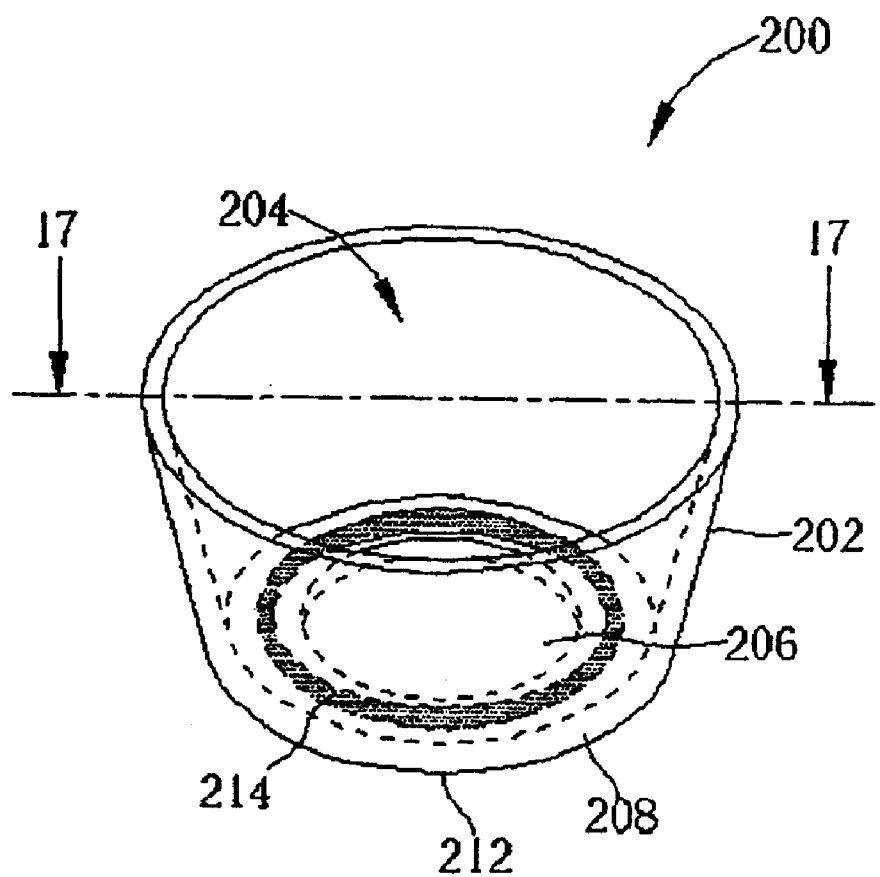
FIG. 16 is a perspective view of a surface isolation device according to the seventh preferred embodiment of the present invention.
Figure 17:
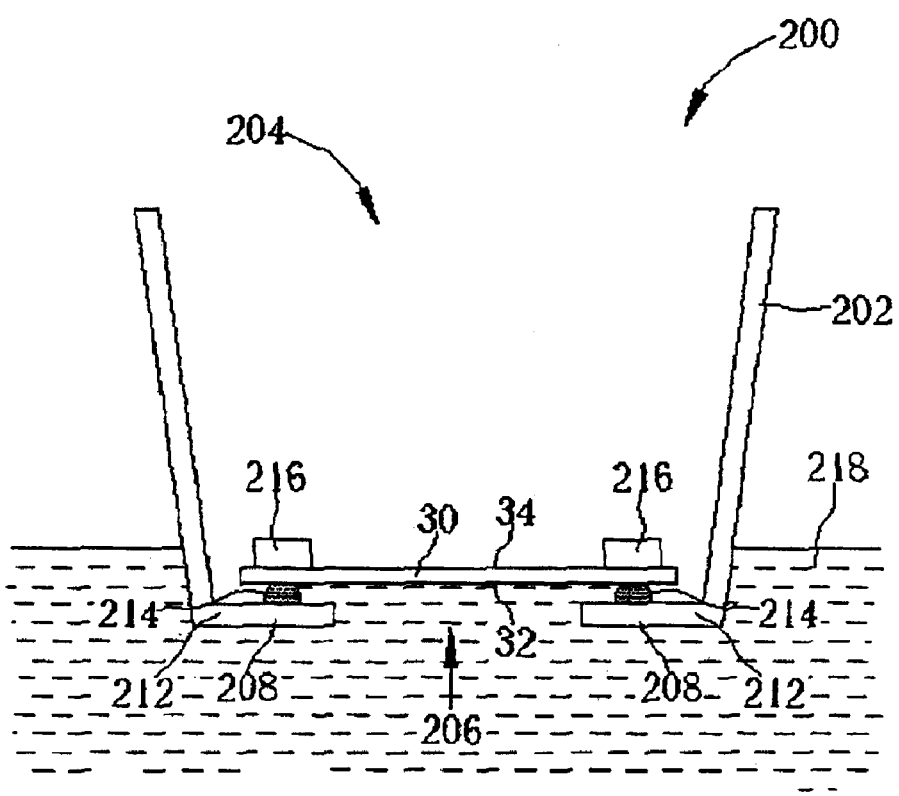
FIG. 17 is a cross-sectional view along line 17—17 showing a surface isolation device.

FIG. 16 is a perspective view of a surface isolation device 200 attached to a wafer 30 according to the seventh preferred embodiment of the present invention. FIG. 17 is a cross-sectional view showing the surface isolation device 200 along line 17—17. The surface isolation device 200 comprises a base 202 for positioning the wafer 30. The base 202 is a hollow cylinder with a top opening 204 and a bottom opening 206. The hollow cylinder comprises a lip 208 surrounding a bottom end 212 of the hollow cylinder. A first isolation ring 214 is placed on the lip 208 and adheres to the first surface 32 of the wafer 30, so that the wafer 30 is fixed to the lip 208 of the base 202. The surface isolation device 200 further comprises a fixture 216 placed on the second surface 34 of the wafer 30 for pushing the wafer 30 toward the base 202 so that the wafer 30 is fixed to the base 202. The fixture 216 is a circular ring. The radius of the circular ring 216 and the radius of the first isolation ring 214 are equal so that the fixture 216 pushes the wafer 30 uniformly to prevent the wafer 30 from cracking. When the circular ring 216 fixes the wafer 30 on the base 202, the bottom end 212 of the surface isolation device 200 is capable of being put into an etching solution 218 to etch the first surface 32 of the wafer 30.

In comparison with the conventional method of surface isolation, the present invention provides the surface isolation device for isolating a predetermined area of a second surface of the wafer from an etching solution while the etching solution etches a first surface of the wafer to form a plurality of manifolds in the wafer. After forming circuits of a print head, the surface isolation device of the present invention is used to isolate the circuits on the second surface of the wafer from the etching solution. This prevents reduction in wafer density due to the pre-formation of manifolds, and it is not necessary to form a passivation film on the second surface of the wafer to isolate the circuits on the second surface from the etching solution. In addition, the surface isolation device clamps the edge of the wafer to isolate the edge from the etching solution, and the no holes are produced on the edge of the wafer.

Those skilled in the art will readily observe that numerous modification and alterations of the device may be made while retaining the teachings of the invention. Accordingly, the above disclosure should be construed as limited only by the metes and bounds of the appended claims.

What is claimed is:

1. A surface isolation device for isolating a predetermined area of a second surface of a wafer from an etching solution when the etching solution etches a first surface of the wafer to form a plurality of manifolds in the wafer, the surface isolation device comprising:

a base for positioning the wafer;

a first isolation ring positioned on the base for isolating the predetermined area from the etching solution;

a fixture for fixing the wafer on the base; and a second isolation ring, the fixture fixing the second isolation ring on the first surface of the wafer so as to isolate an edge of the wafer from the etching solution;

wherein when the fixture fixes the wafer on the base, the wafer adheres to the first isolation ring so as to isolate the predetermined area from the etching solution and the second surface of the wafer faces toward the base and the first isolation ring surrounds the predetermined area.

2. The surface isolation device of claim 1 wherein the fixture is a clamp for clamping the wafer on the base.

3. The surface isolation device of claim 1 wherein the first isolation ring and the second isolation ring clamp the edge of the wafer to isolate the edge from the etching solution.

4. The surface isolation device of claim 1 further comprising a holder for fixing the second isolation ring, the holder comprising an opening, wherein when the fixture fixes the holder above the wafer, the etching solution is capable of flowing through the opening of the holder onto the first surface of the wafer.

5. The surface isolation device of claim 1 wherein the base is a hollow cylinder, the fixture being placed on the second surface of the wafer for pushing the wafer toward the hollow cylinder so that the wafer is fixed on the hollow cylinder, the hollow cylinder comprising a lip surrounding a bottom end of the hollow cylinder, the first isolation ring being placed on the lip and adhering to the first surface of the wafer.

6. The surface isolation device of claim 1 wherein when the fixture fixes the wafer on the base, an external force is applied to the first isolation ring and leads to distortion of the first isolation ring, causing the wafer to adhere to the first isolation ring.

7. The surface isolation device of claim 1 wherein the wafer is a silicon wafer.

8. The surface isolation device of claim 1 wherein when the etching solution etches the first surface of the wafer, a plurality of chambers are formed in the wafer, each of the chambers connected to a corresponding manifold.

9. A surface isolation device for isolating a predetermined area of a second surface of a wafer from an etching solution when the etching solution etches a first surface of the wafer to form a plurality of manifolds in the wafer, the surface isolation device comprising:
   a base for positioning the wafer, the base comprising a first side and a second side;
   a first isolation ring positioned on the base for isolating the predetermined area from the etching solution, the first isolation ring being positioned on the first side of the base;
   a second isolation ring positioned on the second side of the base for isolating a predetermined area of a second surface of a second wafer from the etching solution; and
   a fixture for fixing the wafer on the base;
   wherein when the fixture fixes the wafer on the base, the wafer adheres to the first isolation ring so as to isolate the predetermined area from the etching solution and the second surface of the wafer faces toward the base and the first isolation ring surrounds the predetermined area;
   wherein the second surface of the wafer facing toward the first side of the base when the fixture fixes the wafer on the first side of the base, and the second surface of the second wafer facing toward the second side of the base when the fixture fixes the two second wafer on the second side of the base.

10. The surface isolation device of claim 9 further comprising a third isolation ring and a fourth isolation ring, the fixture fixing the third isolation ring and the fourth isolation ring on the second surface of the wafer and the second surface of the second wafer to isolate an edges of the wafer and an edge of the second wafer the etching solution, respectively.

11. The surface isolation device of claim 10 wherein the first isolation ring and the third isolation ring clamp the edge of the wafer fixed on the first side of the base to isolate the edge of the wafer from the etching solution, and the second isolation ring and the fourth isolation ring clamp the edge of the second wafer fixed on the second side of the base to isolate the edge of the second wafer from the etching solution.

12. The surface isolation device of claim 10 further comprising a first holder and a second holder, the third isolation ring being fixed on the first holder, the fourth isolation ring being fixed on the second holder, each of the two holders having an opening, wherein when the fixture fixes the two holders on the two wafers, the etching solution is capable of flowing through the openings of the two holders onto the first surfaces of the two wafers.

13. The surface isolation device of claim 9 wherein when the fixture fixes the wafer on the base, an external force is applied to the first isolation ring and leads to distortion of the first isolation ring, causing the wafer to adhere to the first isolation ring.

14. A surface isolation device for isolating a predetermined area of a second surface of a wafer from an etching solution when the etching solution etches a first surface of the wafer to form a plurality of manifolds in the wafer, the surface isolation device comprising:
   a base for positioning the wafer;
   a first isolation ring positioned on the base for isolating the predetermined area from the etching solution; and
   a fixture for fixing the wafer on the base, the fixture comprising an attachment ring and an upper cover;
   wherein when the fixture fixes the wafer on the base, the wafer adheres to the first isolation ring so as to isolate the predetermined area from the etching solution;
   wherein the base comprises a tank for placing the wafer, the first isolation ring, and the attachment ring, the attachment ring being placed between the wafer and the upper cover, the upper cover being used for pushing the attachment ring toward the wafer so that the wafer adheres to the first isolation ring, the upper cover having an opening to allow the etching solution to flow onto the first surface of the wafer.

15. The surface isolation device of claim 14 wherein the upper cover further comprises a first screw thread formed on an inner surface of the upper cover for rotatably engaging with a second screw thread on the base so that the upper cover is capable of pushing the attachment ring toward the wafer.

16. The surface isolation device of claim 14 further comprising a second isolation ring fixed to the attachment ring, and when the upper cover pushes the attachment ring toward the wafer, the second isolation ring adheres to the first surface of the wafer to isolate an edge of the wafer from the etching solution.

17. The surface isolation device of claim 14 wherein when the fixture fixes the wafer on the base, an external force is applied to the first isolation ring and leads to distortion of the first isolation ring, causing the wafer to adhere to the first isolation ring.

* * * * *